(12) United States Patent
Udayashankar et al.

(10) Patent No.: US 11,777,463 B2
(45) Date of Patent: Oct. 3, 2023

(54) MULTIPATH PROGRAMMABLE GAIN INSTRUMENTATION AMPLIFIER FRONTEND

(71) Applicant: TEXAS INSTRUMENTS INCORPORATED, Dallas, TX (US)

(72) Inventors: Sudarshan Udayashankar, Marzling (DE); Viola Schaffer, Freising (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/349,393

(22) Filed: Jun. 16, 2021

(65) Prior Publication Data

US 2022/0407483 A1 Dec. 22, 2022

(51) Int. Cl.
*H03G 3/30* (2006.01)
*H03F 3/04* (2006.01)
*H03F 3/45* (2006.01)

(52) U.S. Cl.
CPC ................. *H03G 3/30* (2013.01); *H03F 3/04* (2013.01); *H03F 3/45* (2013.01); *H03F 2200/261* (2013.01); *H03G 2201/103* (2013.01)

(58) Field of Classification Search
CPC .. H03G 3/30; H03G 2201/103; H03G 1/0088; H03G 1/0023; H03G 3/3042; H03G 3/45098; H03G 1/0052; H03G 1/007; H03G 3/3015; H03F 3/04; H03F 2200/261; H03F 3/45183; H03F 3/45475; H03F 3/45479
USPC .......................................... 330/69, 254, 278
See application file for complete search history.

(56) References Cited

U.S. PATENT DOCUMENTS

| | | | | |
|---|---|---|---|---|
| 4,757,274 A | * | 7/1988 | Bowers | H03F 1/56 330/261 |
| 6,294,958 B1 | * | 9/2001 | Eschauzier | H03F 3/3066 330/268 |
| 7,466,199 B2 | * | 12/2008 | Blon | H03F 3/4508 330/263 |
| 8,169,263 B2 | * | 5/2012 | Bofill-Petit | H03F 3/45197 330/260 |
| 9,225,351 B2 | * | 12/2015 | Itakura | H03M 1/0604 |
| 9,362,873 B2 | * | 6/2016 | Harada | H03F 3/45197 |

* cited by examiner

*Primary Examiner* — Khanh V Nguyen
(74) *Attorney, Agent, or Firm* — John R. Pessetto; Frank D. Cimino

(57) ABSTRACT

A system includes an instrumentation amplifier (INA) including a first transistor coupled to a first input node, and a second transistor coupled to a second input node. The INA also includes a resistor coupled between the first transistor and the second transistor. The INA includes a gain resistor network coupled to the resistor and to the first and second transistors, where the gain resistor network includes two or more gain resistors. The system also includes a voltage to current converter, where the voltage to current converter is coupled to the resistor and the gain resistor network.

19 Claims, 6 Drawing Sheets

MULTIPATH PROGRAMMABLE GAIN INSTRUMENTATION AMPLIFIER FRONTEND

BACKGROUND

Instrument amplifiers (INAs) are typically used to amplify weak signals (especially weak signals in a noisy environment) and/or differential signals (they have higher common mode rejection). For example, INAs can be used with sensors (such as those in medical equipment, industrial equipment and motor drives). Current feedback INAs are useful for amplifying small signals with high precision and a high speed to power ratio. The gain in an INA may be set using an external resistor. Programmability of the gain may be achieved with an internal resistor network that changes the gain.

SUMMARY

In accordance with at least one example of the description, a system includes an INA including a first transistor coupled to a first input node, and a second transistor coupled to a second input node. The INA also includes a resistor coupled between the first transistor and the second transistor. The INA includes a gain resistor network coupled to the resistor and to the first and second transistors, where the gain resistor network includes two or more gain resistors. The system also includes a voltage to current converter, where the voltage to current converter is coupled to the resistor and the gain resistor network.

In accordance with at least one example of the description, a system includes an INA including a first transistor, a second transistor, a first resistor, and a gain resistor network. The system also includes a voltage to current converter coupled to the INA and including a first buffer configured to receive a first input signal. The voltage to current converter also includes a second buffer configured to receive a second input signal. The voltage to current converter includes one or more current mirrors configured to provide a current to a second resistor, the second resistor coupled to the first buffer and the second buffer. The voltage to current converter includes a switch for selectively conducting the current to the INA.

In accordance with at least one example of the description, a method includes providing a first input signal to a first input of an INA, and providing a second input signal to a second input of the INA. The method also includes providing the first input signal to a first input of a voltage to current converter, and providing the second input signal to a second input of the voltage to current converter. The method includes generating a current in the voltage to current converter proportional to a difference between the first input signal and the second input signal. The method also includes providing the current to a gain resistor network in the INA. The method includes applying a gain, via the gain resistor network, to the difference between the first input signal and the second input signal, to generate an amplified signal. The method also includes providing the amplified signal to an output of the INA.

BRIEF DESCRIPTION OF THE DRAWINGS

The same reference numbers and other reference designators are used in the drawings to designate the same or similar (functionally and/or structurally) features.

DETAILED DESCRIPTION

INAs that include a programmable gain feature are useful in a larger variety of applications than INAs that do not include a programmable gain feature. Programmable gain enables a user to adjust the gain of the amplifier. Programmable gain may be achieved with an internal gain resistor network that adjusts the gain of the INA. However, if a current-feedback architecture is used for the INA, an input signal-dependent current flows through the entire gain resistor network. Large input signals increase the signal-dependent current, which in turn creates large voltages across the resistors in the internal gain resistor network. These large voltages severely limit the operating signal range of the INA.

In examples herein, the input current feedback loop that provides amplification in the INA is combined with additional circuitry that provides power drive for a gain resistor network. The power drive path drives the resistors of the internal gain resistor network by coupling to a specified gain node in the internal gain resistor network via a switch. Therefore, the unused gain resistors in the internal gain resistor network may receive little or no current, and large voltages may not appear across the unused resistors. The input current feedback loop of the INA may remain relatively unchanged, which may result in a near-constant bandwidth at all gain values. The high power gain path is implemented using a voltage to current converter (V2I) in one example herein. This V2I does not interfere with the input current feedback loop in the INA. The examples herein may provide the advantages of an INA that has a current-feedback architecture with programmable gain circuitry. In one example, the current-feedback architecture may be used as a front end for a programmable gain amplifier (PGA).

Figure 1A:
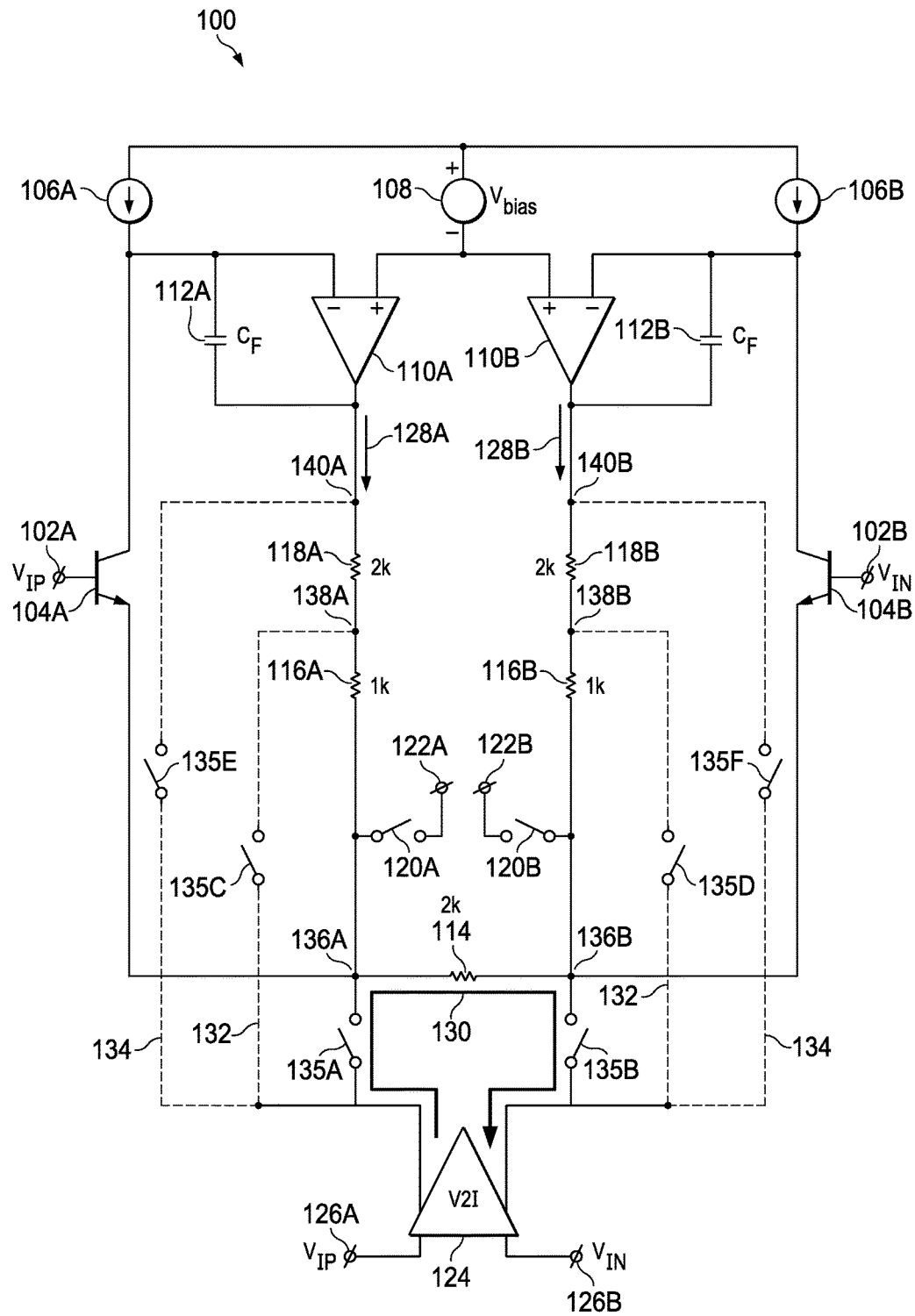
FIG. 1A is a circuit schematic diagram of a system for a programmable gain INA front end in accordance with various examples.

FIG. 1A is a circuit schematic diagram of a system 100 for a programmable gain INA front end in accordance with various examples herein. System 100 includes input nodes 102A and 102B, transistors 104A and 104B, current sources 106A and 106B, voltage source 108, amplifiers 110A and 110B, capacitors 112A and 112B, resistor 114, and gain resistors 116A, 116B, 118A, and 118B. In some examples, current sources 106A and 106B may be replaced with resistors. System 100 also includes switches 120A and 120B, output nodes 122A and 122B, V2I 124, and input nodes 126A and 126B. Currents 128A and 128B are shown in system 100. System 100 also includes paths 130, 132 and 134, switches 135A to 135F (collectively, switches 135), along with nodes 136A, 136B, 138A, 140A, and 140B. Path 130 includes V2I 124, switch 135A, node 136A, resistor 114, node 136B, switch 135B, then back to V2I 124. Path 132 includes V2I 124, switch 135C, node 138A, resistor 116A, node 136A, resistor 114, node 136B, resistor 116B, node 138B, switch 135D, and then back to V2I 124. Path 134 includes V2I 124, switch 135E, node 140A, resistor 118A, node 138A, resistor 116A, node 136A, resistor 114, node 136B, resistor 116B, node 138B, resistor 118B, node 140B, switch 135F, and then back to V2I 124. The internal components of V2I 124 are described with respect to FIG. 2 below. Switches 135A to 135F may be implemented in V2I 124 in some examples as described below, but are shown outside of V2I 124 in FIG. 1A for clarity. In system 100, components 102 to 122 make up the INA.

In system 100, a differential input signal is received at input nodes 102A and 102B. For example, input node 102A may receive a first input signal at 5 volts (V) while input node 102B receives a second input signal at −5 V, for an input differential voltage of 10 V. Input node 102A is coupled to a base of transistor 104A. Input node 102B is coupled to a base of transistor 104B. Transistor 104A is a first transistor and transistor 104B is a second transistor in one example. Transistors 104A and 104B are bipolar junction transistors in this example. However, any type of transistor may be used for transistors 104A and 104B. In another example, transistors 104A and 104B may be field effect transistors, such as metal oxide semiconductor field effect transistors (MOSFETs).

The collector of transistor 104A is coupled to current source 106A. The emitter of transistor 104A is coupled to node 136A, resistor 114, and gain resistor 116A. On the right side of system 100, input node 102B is coupled to a base of transistor 104B. The collector of transistor 104B is coupled to current source 106B. The emitter of transistor 104B is coupled to node 136B, resistor 114, and gain resistor 116B. Current sources 106A and 106B and voltage source 108 provide currents and voltages for the proper operation of the components of system 100.

Transistors 104A and 104B buffer the input signals from input nodes 102A and 102B, respectively, to nodes 136A and 136B, respectively. That is, in one example operation, if a voltage $V_{IP}$ of 5 V is applied at input node 102A, the voltage at node 136A is at or near 5V. If a voltage $V_{IN}$ of −5 V is applied at input node 102B, the voltage at node 136B is at or near −5V. Therefore, resistor 114 has 10 V applied across it. In one example, resistor 114 is a 2 kΩ resistor. The current through resistor 114 is 10V/2 kΩ in this example, or 5 mA.

In a system without V2I 124 to provide a gain path, current 128A would flow from amplifier 110A through gain resistors 118A and 116A, then through resistor 114, then through gain resistors 116B and 118B. Gain resistors 116A and 116B are first gain resistors with a size of 1 kΩ in this example, while gain resistors 118A and 118B are second gain resistors with a size of 2 kΩ in this example. As noted above, the current flowing through the gain resistor network could be 5 mA in one example where a 10 V differential voltage is applied to input nodes 102A and 102B. Two gain resistors (116A and 118A) are shown here in the gain resistor network for simplicity. In many implementations, more gain resistors would be present in the gain resistor network. These additional gain resistors would allow a user to select from among a larger range of gain values. Therefore, the 5 mA current would flow through this larger number of gain resistors, such as a 4 kΩ resistor between gain resistor 118A and amplifier 110A, or a 4 kΩ resistor, an 8 kΩ resistor, a 16 kΩ resistor, etc., all situated between gain resistor 118A and amplifier 110A. Equivalent resistors would be placed between amplifier 110B and gain resistor 118B. The voltage drop between amplifier 110A and node 136A would therefore be 5 mA times the sum of the resistances in the gain resistor network between amplifier 110A and node 136A. If the total resistance in the gain resistor network was 16 kΩ+8 kΩ+4 kΩ+2 kΩ+1 kΩ=31 kΩ, the voltage drop would be 155 V (31 kΩ×5 mA). A similar voltage drop would also be present between amplifier 110B and node 136B. A voltage of this size would saturate amplifiers 110A and 110B, and system 100 would be unusable. Therefore, this example system is unable to provide a large gain due to the signal-dependent current flowing the entire gain resistor network. In examples herein, V2I 124 provides gain without the signal-dependent current flowing through the entire gain resistor network.

In an example herein, V2I 124 provides current to the gain resistor network. Because V2I 124 provides current, amplifiers 110A and 110B do not provide the current to the gain resistor network. Amplifier 110A may be a first amplifier with an amplifier output coupled to the gain resistors, such as gain resistor 118A. A first amplifier input of amplifier 110A is coupled to voltage source 108, and a second amplifier input of amplifier 110A is coupled to transistor 104A and current source 106A. Amplifier 110B may be a second amplifier with an amplifier output coupled to the gain resistors, such as gain resistor 118B. A first amplifier input of amplifier 110B is coupled to voltage source 108 (or an equivalent voltage), and a second amplifier input of amplifier 110B is coupled to transistor 104B and current source 106B.

The current provided by V2I 124 tracks the differential input voltage. A voltage equivalent to $V_{IP}$ is provided to input node 126A, and a voltage equivalent to $V_{IN}$ is provided to input node 126B. V2I 124 may act as a buffer with a gain of 1 connected to each input node 126A and 126B. In other examples, the buffer may have a gain other than 1. V2I 124 also has an internal resistor that matches resistor 114. In this example, resistor 114 is 2 kΩ, so the internal resistor in V2I 124 is 2 kΩ. The internal resistor in V2I 124 therefore has the differential voltage $V_{IP}-V_{IN}$ applied across it. If $V_{IP}$ is 5 V, and $V_{IN}$ is −5 V, 10 V is applied across the 2 kΩ internal resistor to provide a current of 5 mA. This external current of 5 mA may be delivered to the INA at different locations within the gain resistor network depending on the amount of programmable gain that is selected.

In one example, to provide a gain of 1, V2I 124 uses internal switches to provide current along path 130 by coupling to nodes 136A and 136B. The switches are shown as switches 135 (135A and 135B) in this example, although the switches may be internal to V2I 124 in other examples. In the example above, a 5 mA current flows from V2I 124, through resistor 114, and back to V2I 124, when switches 135A and 135B are closed, and the other switches 135C to 135F are open. The 5 mA current creates a voltage of 10 V across resistor 114. If switches 120A and 120B are closed, then a voltage of 10 V also appears across output nodes 122A and 122B. Therefore, with an input differential voltage of 10 V, a gain of 1 may be achieved that provides an output differential voltage of 10 V. This gain of 1 is achieved by coupling V2I 124 to the INA at nodes 136A and 136B via switches 135A and 135B.

Figure 1B:
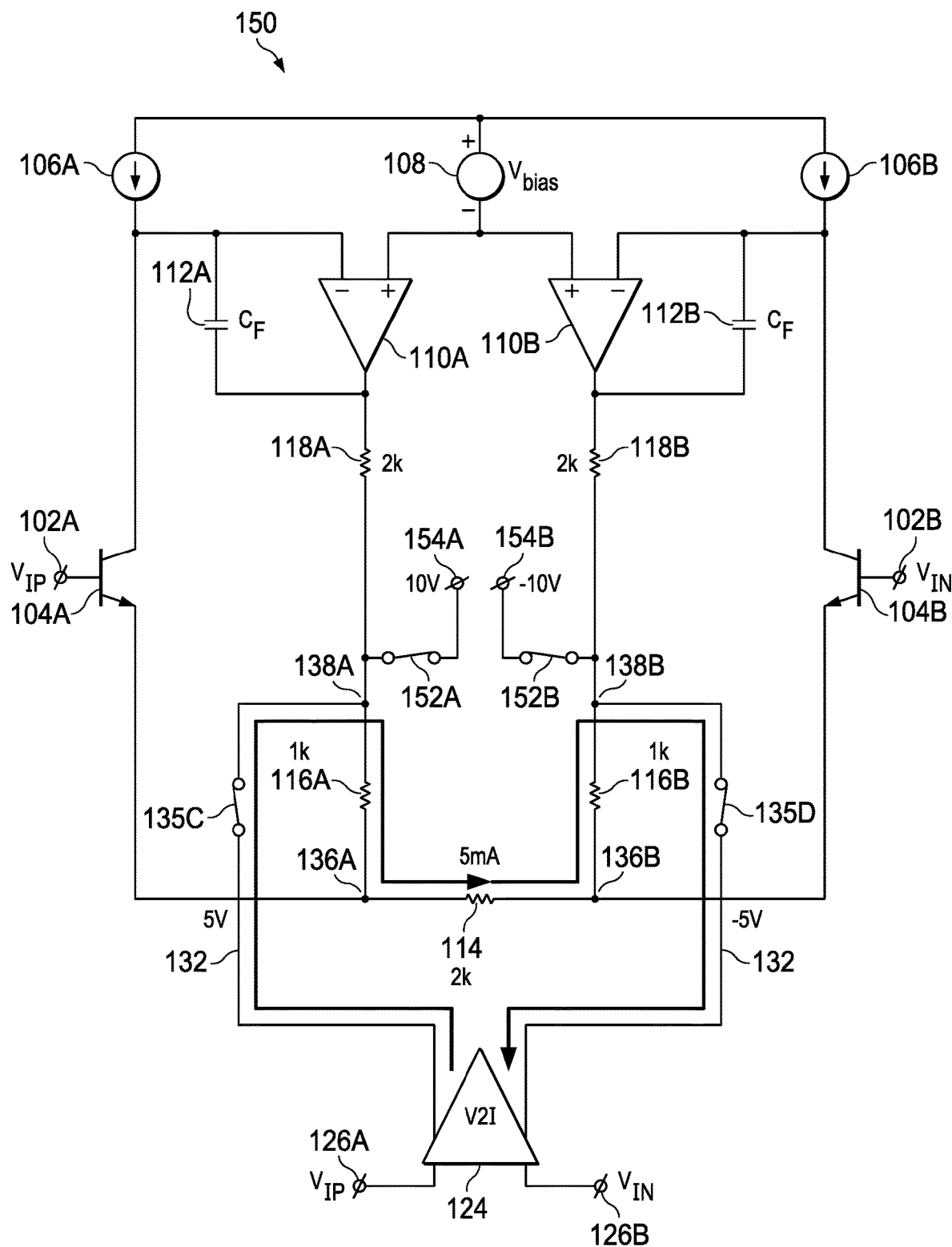
FIG. 1B is a circuit schematic diagram of a system for a programmable gain INA front end in accordance with various examples.

FIG. 1B is a circuit schematic diagram of a system 150 (which is similar to system 100 except that certain switches in system 100 are open or closed in the implementation of system 150) for a programmable gain INA front end in accordance with various examples herein. System 150 shows the connections and output nodes that provide a gain of 2 via path 132. Paths 130 and 134 are not shown in FIG. 1B for simplicity. A different gain is provided by providing the current from V2I 124 to a different combination of gain resistors in the gain resistor network. In FIGS. 1A and 1B, like numerals denote like components. System 150 includes switches 152A and 152B, and output nodes 154A and 154B. FIG. 1B shows V2I 124 coupled to nodes 138A and 138B of the INA. Internal switches within V2I 124 couple V2I 124 to the INA at nodes 138A and 138B. In this example, the internal switches are shown as closed switches 135C and 135D outside of V2I 124 for clarity. With this coupling, current flows along path 132 from V2I 124 to node 138A, then through gain resistor 116A, resistor 114, and gain resistor 116B. The current reaches node 138B and continues to follow path 132 back to V2I 124. If V2I 124 has a differential input voltage of 10 V, and an internal resistor of 2 kΩ, the current that flows is 5 mA. A 5 mA current that flows through 1 kΩ gain resistor 116A, 2 kΩ resistor 114, and 1 kΩ gain resistor 116B creates a voltage of 20 V (5 mA×4 kΩ) between nodes 138A and 138B. Output nodes 154A and 154B are coupled to nodes 138A and 138B, respectively, through switches 152A and 152B. The voltage across output nodes 154A and 154B is 20 V. Therefore, a differential input voltage of 10 V creates an output differential voltage of 20 V, for a gain of 2. The gain of 2 may be achieved by coupling V2I 124 to the INA at the appropriate nodes within the gain resistor network, so that a specific combination of resistors receives the current and produces a voltage across the gain resistors.

Referring again to FIG. 1A, a gain of 4 may be achieved. Internal switches (e.g., switches 135E and 135F) within V2I 124 may couple V2I 124 to the INA at nodes 140A and 140B. With this coupling, current flows along path 134 from V2I 124 to node 140A, then through gain resistor 118A, gain resistor 116A, resistor 114, gain resistor 116B, and gain resistor 118B. The current reaches node 140B and continues to follow path 134 back to V2I 124. If V2I 124 has a differential input voltage of 10 V, and an internal resistor of 2 kΩ, the current that flows is 5 mA. A 5 mA current that flows through 2 kΩ gain resistor 118A, 1 kΩ gain resistor 116A, 2 kΩ resistor 114, 1 kΩ gain resistor 116B, and 2 kΩ gain resistor 118B creates a voltage of 40 V (5 mA×8 kΩ) between nodes 140A and 140B. If output nodes are coupled to nodes 140A and 140B (not shown in FIG. 1A), the voltage across those output nodes would be 40 V. Therefore, a differential input voltage of 10 V creates an output differential voltage of 40 V, for a gain of 4.

In an example implementation, a series of switches and output nodes may be coupled at the appropriate nodes between resistors in the gain resistor network to provide output nodes for every level of gain that the gain amplifier produces. For example, if the gain amplifier provides programmable gains of 1, 2, 4, 8, 16, and 32, then six sets of output nodes and switches would be implemented in system 100. Also, appropriate connection paths (like paths 132 and 134) between V2I 124 and the INA are also implemented so each programmable gain level may be achieved. Switches 135 are shown outside of V2I 124 in this example for clarity.

Only gain resistors 116A, 116B, 118A, and 118B are shown for the gain resistor network in FIG. 1A. In an example implementation, other resistors may be included in the gain resistor network to allow for larger gains. For example, a 4 kΩ, 8 kΩ, and 16 kΩ resistor may be situated between gain resistor 118A and amplifier 110A, and a 4 kΩ, 8 kΩ, and 16 kΩ resistor may also be situated between gain resistor 118B and amplifier 110B. With these additional resistors in the gain resistor network, gains of 8, 16, and 32 could be achieved with system 100. To achieve higher gains, even more resistors could be added to the gain resistor network. Gains of other sizes may also be achieved by including appropriately sized resistors in the gain resistor network.

With the examples described above, an INA may be implemented with programmable gain. The power path is provided by V2I 124 and related circuitry, while the signal path is provided by the amplifiers 110A and 110B and the gain resistor network. The signal path provides a precise amplifier with a wide bandwidth. Therefore, the examples herein provide a multipath architecture.

Figure 2:
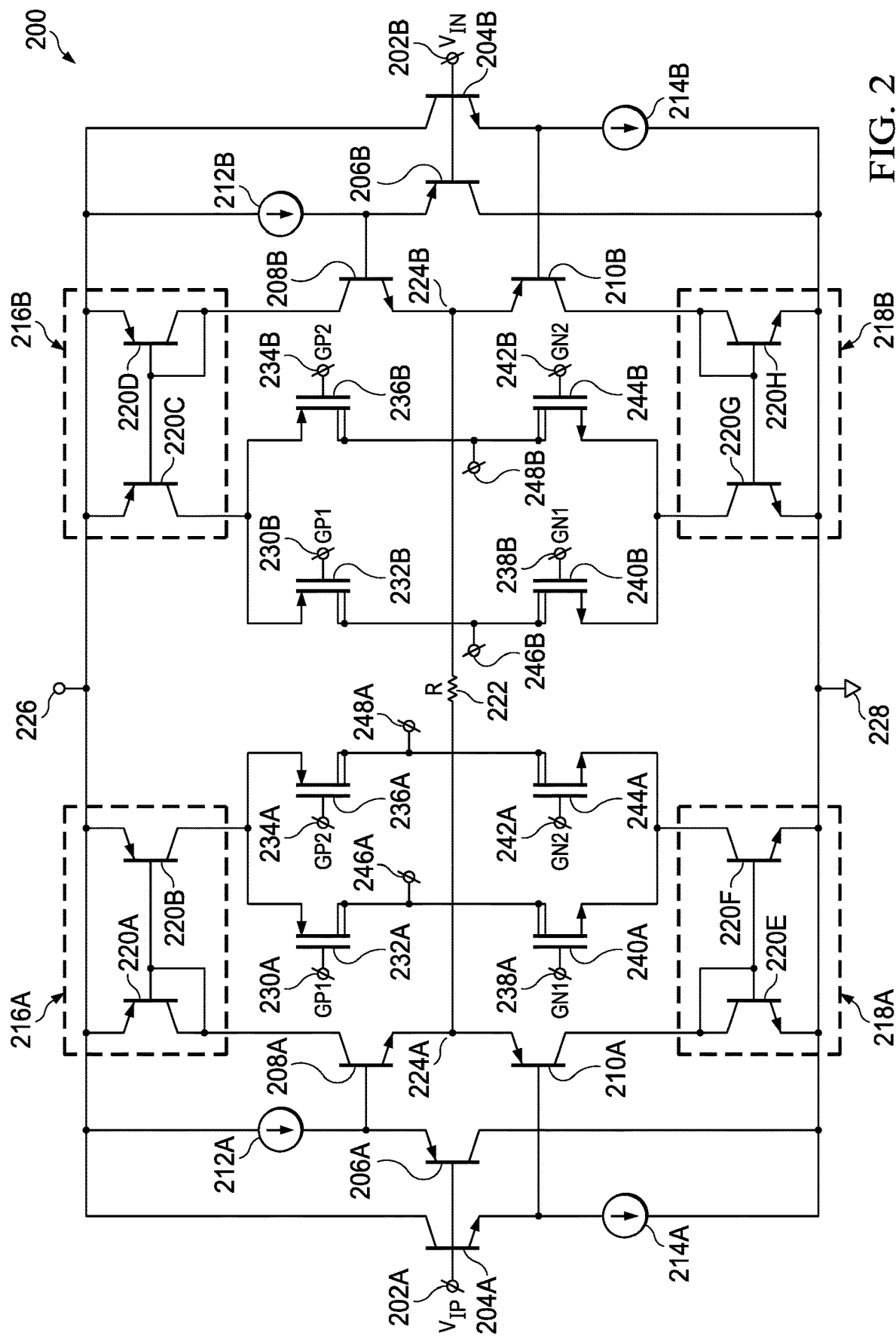
FIG. 2 is a circuit schematic diagram of a voltage to current converter in accordance with various examples.

FIG. 2 is a circuit schematic diagram of a V2I 200 in accordance with various examples herein. V2I 200 is an example implementation for V2I 124 as described above. V2I 200 couples to the INA as shown in FIGS. 1A and 1B and provides a current based on the voltage difference applied at the two input nodes. The current may be provided to the appropriate nodes of the gain resistor network in the INA to achieve a programmable gain by the amplifier.

V2I 200 includes input nodes 202A and 202B, transistors 204A, 204B, 206A, 206B, 208A, 208B, 210A, and 210B. V2I 200 includes current sources 212A, 212B, 214A, and 214B. V2I 200 includes current mirrors 216A, 216B, 218A, and 218B. Current mirrors 216A, 216B, 218A, and 218B each include two transistors, which are labeled 220A-220H. Resistor 222 is coupled to nodes 224A and 224B, and resistor 222 matches resistor 114 in FIG. 1A in one example. V2I 200 includes node 226 coupled to a voltage source and node 228 coupled to ground. V2I 200 includes nodes 230A and 230B, which are coupled to a gate of transistors 232A and 232B, respectively. Nodes 234A and 234B are coupled to a gate of transistors 236A and 236B, respectively. Nodes 238A and 238B are coupled to a gate of transistors 240A and 240B, respectively. Nodes 242A and 242B are coupled to a gate of transistors 244A and 244B, respectively. V2I 200 also includes nodes 246A, 246B, 248A, and 248B.

Transistors 204A, 204B, 206A, 206B, 208A, 208B, 210A, and 210B are bipolar junction transistors (BJTs) in this example, but may be any type of transistor in other examples, such as field effect transistors (FETS). Transistors 232A, 232B, 236A, 236B, 240A, 240B, 244A, and 244B are FETS in this example, but may be any type of transistor in other examples. Transistors 220A-220H that make up current mirrors 216A, 216B, 218A, and 218B are BJTs in this example, but may be any type of transistor in other examples.

Current sources 212A, 212B, 214A, and 214B provide current to the components in V2I 200 for the operation of the circuit. In operation, V2I 200 receives a differential input signal at input nodes 202A and 202B, such as 5V at input node 202A and −5V at input node 202B. With the differential input signal, V2I 200 provides a current to the INA as shown in FIGS. 1A and 1B. Transistors 232A, 232B, 236A, 236B, 240A, 240B, 244A, and 244B may be selectively turned on and off to provide the current to the appropriate nodes 246A, 246B, 248A, and 248B. These nodes couple to the gain resistor network of the INA as described above with respect to FIG. 1A, and the current is provided to the appropriate nodes (or locations) in the gain resistor network that realizes the programmed gain. In this example, two pairs of nodes of V2I 200 are shown for simplicity (nodes 246 and 248), along with their respective switches (transistors 232A, 232B, 236A, 236B, 240A, 240B, 244A, and 244B). However, in an example implementation, V2I 200 has more sets of nodes than two, so the nodes in V2I 200 may couple to the appropriate nodes of the gain resistor network of the INA in FIG. 1A to provide the full range of programmable gain amounts. For example, if the gain resistor network within the INA offered programmable gain of 1, 2, 4, 8, 16, and 32, 6 pairs of nodes may be used by V2I 200, with each pair of nodes coupled to the appropriate nodes in the gain resistor network of the INA to provide the programmed gain. V2I 200 also has sets of switches for each pair of nodes, which are embodied in transistors 232A, 232B, 236A, 236B, 240A, 240B, 244A, and 244B. If V2I 200 has additional nodes to provide more gain amounts, V2I 200 may also have additional transistor switches to switch between the additional nodes. Any number of different available gain amounts may be realized in other examples. Transistors 232A, 232B, 236A, 236B, 240A, 240B, 244A, and 244B operate as switches in this example, and are represented by switches 135 in FIG. 1A in one example.

Referring again to FIG. 2, transistors 204A, 204B, 206A, 206B, 208A, 208B, 210A, and 210B act as buffers to buffer the input signal applied at input nodes 202A and 202B. Transistors 204A, 206A, 208A, and 210A may act as a first buffer with a gain of 1. Transistors 204B, 206B, 208B, and 210B may act as a second buffer with a gain of 1. These buffers buffer the input signal from input nodes 202A and 202B to nodes 224A and 224B, respectively. Because the gain is 1, the input signals that appear at input nodes 202A and 202B also appear at nodes 224A and 224B, respectively. Resistor 222 is referred to above, with respect to FIGS. 1A and 1B, as the internal resistor of V2I 124 and is coupled between nodes 224A and 224B. Therefore, the current that flows through resistor 222 is the differential input voltage divided by the value of resistor 222. This current is provided to the appropriate nodes of the INA in FIGS. 1A and 1B via nodes 246 (246A and/or 246B), 248 (248A and/or 248B), or other nodes not shown in FIG. 2. Current mirrors 216A, 216B, 218A, and 218B operate to mirror the current that flows through resistor 222. As one example, current may flow from current mirror 216A, through transistor 208A, through resistor 222, through transistor 210B, and through current mirror 218B.

Nodes 230A, 230B, 234A, 234B, 238A, 238B, 242A, and 242B are coupled to the gates of transistors 232A, 232B, 236A, 236B, 240A, 240B, 244A, and 244B, respectively. Signals (such as voltages) received at these nodes operate to turn the respective transistors on or off in order to change the nodes (246, 248, etc.) where the current is provided to the INA. The appropriate node 246, 248, etc. is selected to provide a specific gain. For example, to provide a gain of 1, the current from V2I 200 may be provided to the INA via nodes 246A and 246B. Node 246A couples to node 136A in FIG. 1A, and node 246B couples to node 136B in FIG. 1A. Nodes 246A and 246B are activated by turning on transistors 232A, 232B, 240A, and 240B. Transistors 232A, 232B, 240A, and 240B are turned on by providing an appropriate signal to nodes 230A, 230B, 238A, and 238B. In addition, during this time transistors 236A, 236B, 244A, and 244B are turned off by providing appropriate signals to the nodes coupled to the gates of those transistors (e.g., nodes 234A, 234B, 242A, and 242B). With transistors 236A, 236B, 244A, and 244B turned off, no signal is provided from V2I 200 to the INA via nodes 248A and 248B.

To provide a gain of 2, the current from V2I 200 may be provided to the INA via nodes 248A and 248B. Node 248A couples to node 138A in FIG. 1B, and node 248B couples to node 138B in FIG. 1B. Nodes 248A and 248B are activated by turning on transistors 236A, 236B, 244A, and 244B. Transistors 236A, 236B, 244A, and 244B are turned on by providing an appropriate signal to nodes 234A, 234B, 242A, and 242B. In addition, during this time transistors 232A, 232B, 240A, and 240B are turned off by providing appropriate signals to the nodes coupled to the gates of those transistors (e.g., 230A, 230B, 238A, and 238B).

Figure 3:
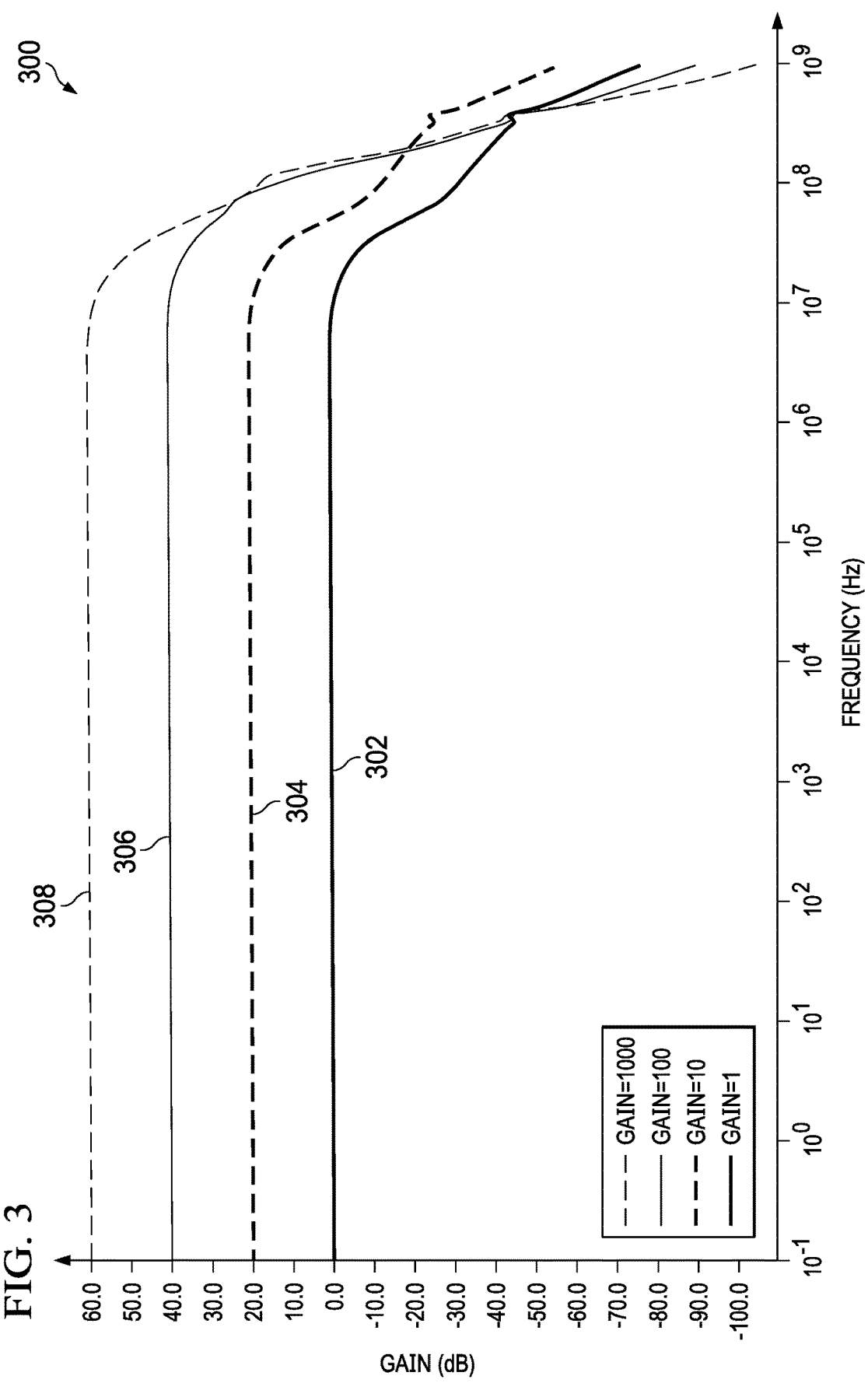
FIG. 3 is a graph depicting relationships between gain and frequency in accordance with various examples.

FIG. 3 is a graph 300 depicting relationships between gain and frequency in accordance with various examples herein. The gain in decibels (dB) is shown on the y-axis, while the x-axis indicates the frequency in Hertz (Hz). Four curves are shown on graph 300. Curve 302 shows the frequency response for a programmable gain INA as described herein with a gain of 1. Curve 304 shows the frequency response for a programmable gain INA as described herein with a gain of 10. Curve 306 shows the frequency response for a programmable gain INA as described herein with a gain of 100. Curve 308 shows the frequency response for a programmable gain INA as described herein with a gain of 1000.

As shown in graph 300, a programmable gain INA of some example embodiments with a gain of either 1, 10, 100, or 1000 has a bandwidth of approximately 20 MHz. That is, the bandwidth does not decrease as the gain increases, which is the case for many conventional systems. In conventional systems, the bandwidth is often inversely proportional to the gain. If the gain increases, the bandwidth decreases. With the examples described herein, however, the bandwidth may remain relatively high even as the gain increases substantially (e.g., from 1 to 1000).

Figure 4:
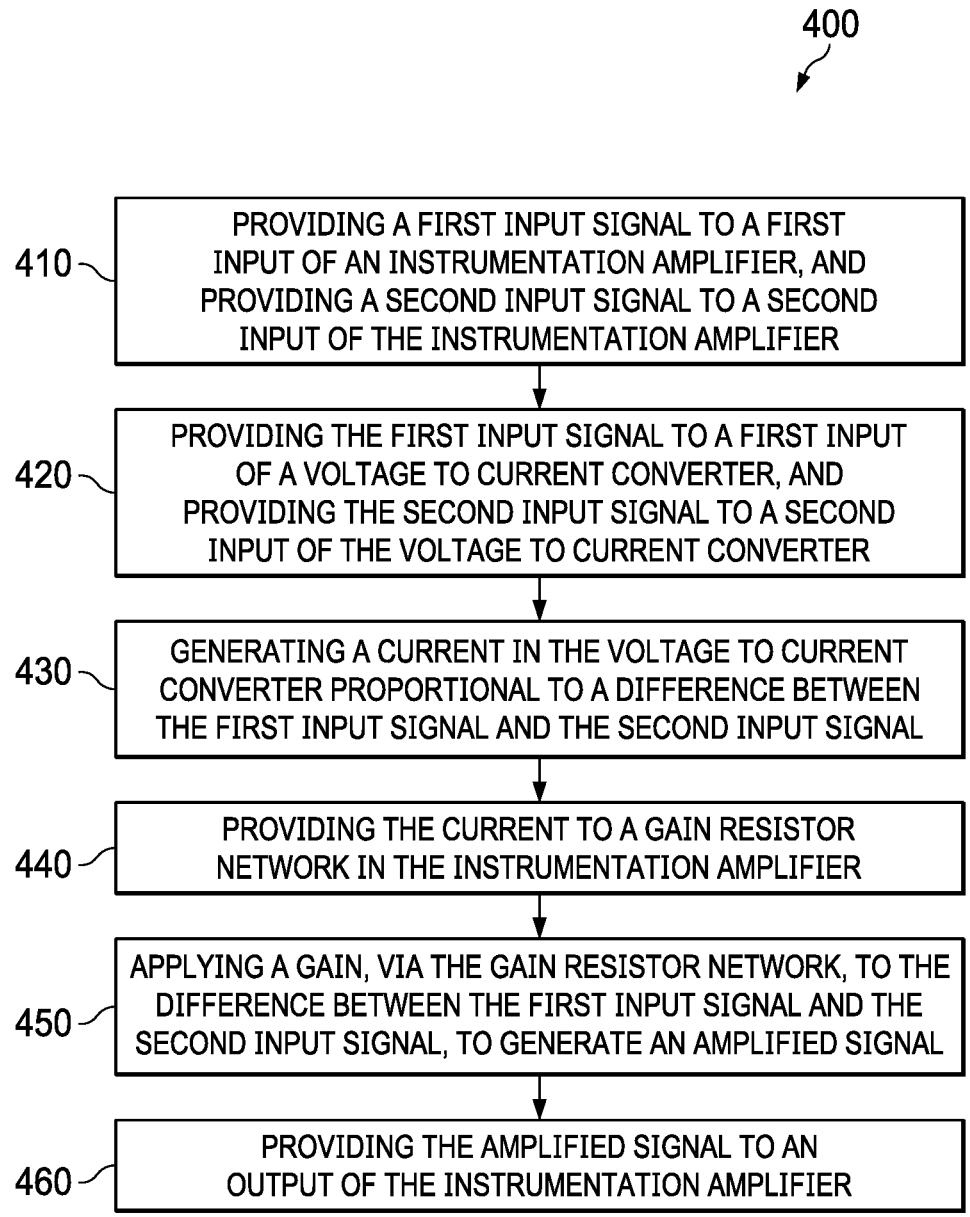
FIG. 4 is a flow diagram of a method for providing programmable gain in an INA in accordance with various examples.

FIG. 4 is a flow diagram of a method 400 for providing programmable gain in an INA in accordance with various examples herein. The steps of method 400 may be performed in any suitable order. The hardware components described above with respect to FIGS. 1A, 1B, and 2 may perform method 400 in one example.

Method 400 begins at 410, where a first input signal is provided to a first input of an INA, and a second input signal is provided to a second input of the INA. As described above, a $V_{IP}$ signal may be provided to input node 102A, while a $V_{IN}$ signal may be provided to input node 102B.

Method 400 continues at 420, where the first input signal (or an equivalent signal) is provided to a first input of a V2I, and the second input signal (or an equivalent signal) is provided to a second input of the V2I. As described above, the $V_{IP}$ signal may be provided to input node 126A, while a $V_{IN}$ signal may be provided to input node 126B.

Method 400 continues at 430, where the V2I generates a current proportional to the difference between the first input signal and the second input signal. In one example, transistors at the inputs of the V2I act as buffers, and buffer the input signals to nodes 224A and 224B. Those nodes provide the voltage difference across an internal resistor in the V2I, such as resistor 222. Providing a voltage difference across resistor 222 generates a current.

Method 400 continues at 440, where the V2I provides the current to a gain resistor network in the INA. The current may be provided by activating specific switches in the V2I that couple the V2I to certain nodes within the gain resistor network of the INA.

Method 400 continues at 450, where the gain resistor network applies a gain to the difference between the first input signal and the second input signal, to generate an amplified signal. The gain is applied by providing the current through specific resistors in the gain resistor network. The more resistors that the current flows through, the higher the gain of the amplified signal. Resistors may be selected to provide a specific gain.

Method 400 continues at 460, wherein the gain resistor network provides the amplified signal to an output of the INA. As one example, output nodes 122A and 122B are coupled to the gain resistor network and receive the amplified signal. Multiple sets of output nodes may be present in some examples, even one set for each level of gain provided by the gain resistor network in one example. Switches may be used to select the appropriate output nodes in one example.

Figure 5:
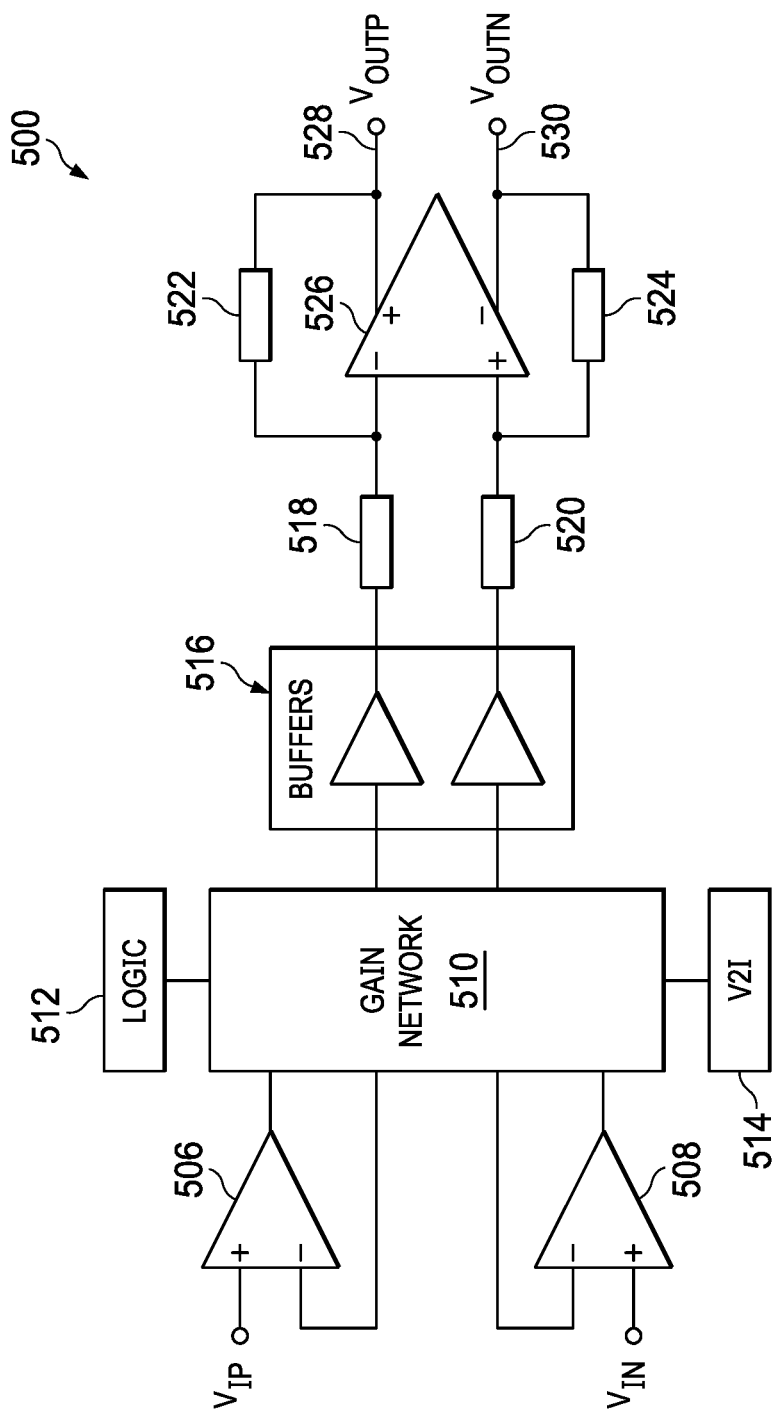
FIG. 5 is a block diagram of a programmable gain INA in accordance with various examples.

FIG. 5 is an example of a programmable gain INA 500 in accordance with various examples. FIG. 5 is one example of a programmable gain INA 500 with additional circuitry that provides power drive for a gain resistor network (e.g., with a V2I circuit). In other examples, some of the components of programmable gain INA 500 shown in FIG. 5 may be absent. In other examples, programmable gain INA 500 may include additional components not shown in FIG. 5.

Programmable gain INA 500 includes input nodes 502 and 504, amplifiers 506 and 508, gain network 510, logic 512, and V2I 514. Programmable gain INA 500 also includes buffers 516, resistors 518, 520, 522, and 524, amplifier 526, and output nodes 528 and 530.

In one example, a differential input signal is received at input nodes 502 and 504. For example, input node 502 may receive a first input signal at 5 V ($V_{IP}$) while input node 504 may receive a second input signal at −5 V ($V_{IN}$), for an input differential voltage of 10 V. Amplifiers 506 and 508 receive the input signals from input nodes 502 and 504. Amplifiers 506 and 508 may be amplifiers 110A and 110B shown in FIG. 1A in one example. The outputs of amplifiers 506 and 508 are coupled to gain network 510. Gain network 510 may include a network of switches and resistors as described above with respect to FIGS. 1A and 1B. Logic 512 may be coupled to gain network 510 in one example. Logic 512 may include any suitable hardware and/or software to provide the functions described herein. Logic 512 may include input and output connections that allow a user to select the amount of gain provided by gain network 510. In one example, gain network 510 may provide gains of 0.125, 0.25, 0.5, 1, 2, 4, 8, 16, etc. Gains of sizes other than multiples of two may also be provided in some examples. Gain network 510 and logic 512 provide a user the ability to select the gain for programmable gain INA 500.

Programmable gain INA 500 also includes V2I 514. V2I 514 operates as described above with respect to FIGS. 1A, 1B, and 2. V2I 514 is a voltage to current converter that implements a power gain path for programmable gain INA 500. V2I 124 provides current to gain network 510, and therefore the current to gain network 510 is not provided by amplifiers 506 and 508. Programmable gain INA 500 also includes buffers 516. Buffers 516 may be high impedance buffers in one example. Output signals from gain network 510 are provided to buffers 516. Any suitable circuitry may be used to implement buffers 516.

Programmable gain INA 500 also includes resistors 518, 520, 522, 524, and amplifier 526. Amplifier 526 provides a differential output signal at output nodes 528 and 530. Output node 528 may provide a positive output signal ($V_{OUTP}$), while output node 530 may provide a negative output signal ($V_{OUTN}$). The output signal may be a multiple of the input signal, depending on the gain selected by logic 512 and provided by gain network 510.

The term "couple" is used throughout the specification. The term may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A system, comprising:
an instrumentation amplifier (INA) including:

a first transistor coupled to a first input terminal, and a second transistor coupled to a second input terminal;

a resistor coupled between the first transistor and the second transistor; and a gain resistor network coupled to the resistor and to the first and second transistors, wherein the gain resistor network includes two or more gain resistors;

a voltage to current converter, wherein the voltage to current converter is coupled to the resistor and the gain resistor network; and an amplifier having an amplifier output and first and second amplifier inputs, wherein the amplifier output is coupled to the gain resistor network, the first amplifier input is coupled to a voltage source, and the second amplifier input is coupled to the first transistor.

2. The system of claim 1, wherein the gain resistor network includes a first gain resistor and a second gain resistor, and wherein the first gain resistor has a different resistance than the second gain resistor.

3. The system of claim 1, wherein the voltage to current converter is configured to provide a current to the resistor and the gain resistor network.

4. The system of claim 1, wherein the two or more gain resistors are configured to provide a programmable gain to a first input signal received at the first input terminal and a second input signal received at the second input terminal.

5. The system of claim 1, wherein the gain resistor network includes a first gain resistor and a second gain resistor, and wherein the first gain resistor has approximately a same resistance as the second gain resistor.

6. The system of claim 1, wherein the voltage to current converter includes a network of switches to couple the voltage to current converter between two gain resistors in the gain resistor network.

7. A system, comprising:

an instrumentation amplifier (INA) including a first transistor, a second transistor, a first resistor, and a gain resistor network; and a voltage to current converter coupled to the INA and including:

a first buffer configured to receive a first input signal;

a second buffer configured to receive a second input signal;

one or more current mirrors configured to provide a current to a second resistor, the second resistor coupled to the first buffer and the second buffer; and a switch for selectively conducting the current to the INA.

8. The system of claim 7, wherein the gain resistor network includes two or more gain resistors, and wherein the gain resistors are configured to provide a programmable gain to a difference between the first input signal and the second input signal.

9. The system of claim 7, wherein the first transistor is configured to provide the first input signal to the first resistor, and the second transistor is configured to provide the second input signal to the first resistor.

10. The system of claim 7, wherein the voltage to current converter includes a plurality of switches, and wherein a switch is configured to provide the current to a different location within the gain resistor network.

11. The system of claim 10, wherein providing the current to a different location within the gain resistor network results in a different gain for the gain resistor network.

12. The system of claim 7, wherein the first buffer is configured to provide the first input signal to the second resistor, and wherein the second buffer is configured to provide the second input signal to the second resistor.

13. The system of claim 7, wherein the INA includes an amplifier having an amplifier output and first and second amplifier inputs, wherein the amplifier output is coupled to the gain resistor network, the first amplifier input is coupled to a voltage source, and the second amplifier input is coupled to the first transistor.

14. A method, comprising:

providing a first input signal to a first input of an instrumentation amplifier (INA), and providing a second input signal to a second input of the INA;

providing the first input signal to a first input of a voltage to current converter, and providing the second input signal to a second input of the voltage to current converter;

generating a current in the voltage to current converter proportional to a difference between the first input signal and the second input signal;

providing the current to a gain resistor network in the INA;

applying a gain, via the gain resistor network, to the difference between the first input signal and the second input signal, to generate an amplified signal; and providing the amplified signal to an output of the INA.

15. The method of claim 14, wherein generating the current includes:

providing the difference between the first input signal and the second input signal across a resistor in the voltage to current converter.

16. The method of claim 14, wherein providing the current to the gain resistor network includes:

activating a switch to couple the voltage to current converter to the gain resistor network.

17. The method of claim 16, wherein the switch is selected to adjust an amount of gain applied via the gain resistor network.

18. The method of claim 14, wherein the gain resistor network is configured to provide two or more gain values to the difference between the first input signal and the second input signal.

19. The method of claim 18, wherein a bandwidth of the INA is approximately equal for each of the two or more gain values.

* * * * *